United States Patent [19]

Teich

[11] 4,420,651

[45] Dec. 13, 1983

[54] PROXIMITY SWITCH OPERABLE WITHOUT PHYSICAL CONTACT

[75] Inventor: Dieter Teich, Schwandorf, Fed. Rep. of Germany

[73] Assignee: Siemens Aktiengesellschaft, Berlin and Munich, Fed. Rep. of Germany

[21] Appl. No.: 294,035

[22] Filed: Aug. 18, 1981

[30] Foreign Application Priority Data

Sep. 8, 1980 [DE] Fed. Rep. of Germany ....... 3033750

[51] Int. Cl.$^3$ ............................................... H05K 5/00
[52] U.S. Cl. .................................. 174/50; 174/52 R; 200/303; 361/179; 403/4
[58] Field of Search ............... 174/50, 52 R; 328/5; 340/693; 361/179, 180, 181; 200/303; 73/431; 403/340, 4; 46/25, 28

[56] References Cited

U.S. PATENT DOCUMENTS 4,314,310 2/1982 Schmidt ....................... 174/52 R X

FOREIGN PATENT DOCUMENTS 1566089 4/1980 United Kingdom .

Primary Examiner—A. T. Grimley
Assistant Examiner—D. A. Tone
Attorney, Agent, or Firm—Kenyon & Kenyon

[57] ABSTRACT

A proximity switch, operable without physical contact and having an elongated columnar housing which has, perpendicular to its principal axis, a cross-sectional shape with two orthogonal axes of symmetry. The housing is divided into at least two parts and the parts are joined at three abutting surfaces. One of the abutting surfaces extends in the plane of the principal axis and the others intersect the first surface, extending at angles of 90° thereto. The greatest length of the first abutting surface, measured in the direction of the principal axis, is the same as the distance between the principal axis and the outer surface of the housing. With this arrangement, it is possible to arrange the sensor head carrying the sensor operating surface so that the operating surface lies on the longitudinal axis or at 90° to the longitudinal axis in such a manner that the sensor surface does not extend beyond a generatrix of the outer surface.

2 Claims, 7 Drawing Figures

PROXIMITY SWITCH OPERABLE WITHOUT PHYSICAL CONTACT

BACKGROUND OF THE INVENTION

This invention relates to a proximity switch which can be operated without physical contact. The switch has an elongated columnar housing with a cross section having orthogonal axes of symmetry which are perpendicular to its principal axis. The housing is divided into at least two housing parts joined at abutting surfaces which lie at an angle to the principal axis.

In a proximity switch of the above-mentioned general type known from British Pat. No. 1,566,089, the housing parts are bounded by surfaces which face each other and which extend at a sharp angle, preferably 45°, to the longitudinal axis of the housing. In a proximity switch of this kind it is possible to align the operating axis of the sensing head with the longitudinal axis of the prismatic housing as well as transversely thereto. However, when the sensing head is arranged with its operating axis transverse to the longitudinal axis of the housing, the sensor surface extends beyond the lateral outside surface of the housing. This is necessary so that the cup core of the sensor, which has a predetermined height, can be accommodated in the cross section of the columnar housing. This is particularly true when the housing has a circular cross section.

SUMMARY OF THE INVENTION

It is an object of the present invention to provide a proximity switch of the above-mentioned type in which the sensor surface lies in the extension of at least one generatrix of the outside lateral surface of the housing when the chosen operating direction of the sensor is transverse to the longitudinal axis of the housing. This is achieved by providing each housing part with a mating end having three abutting surfaces. One of the abutting surfaces extends in the plane of the principal axis and the others extend at an angle of 90°to the first surface as measured at the respective intersection with the first named surface. The greatest length of the abutting surface which extends in the direction of the principal axis is made equal to the distance between the principal axis and the outside surface of the housing. In this way, when the position of the active surface of the switch is shifted from the end of the housing to the side of the housing, the full cross section of the proximity switch housing is also available in half the width of the proximity switch. As a result, a cup core can easily be accommodated in the circular end housing of the proximity switch for use in either position without the impairment of response which results from reducing the height of the cup core to make it fit.

The principles of the invention can also be applied to advantage in a proximity switch operable without physical contact having a circular cross section such as is shown in British Pat. No. 1,566,089. When this is done, the abutting surface which lies in the direction of the principal axis is defined by a straight boundary line where that surface meets the endmost lateral abutting surface and by an inwardly extending semicircle of the same radius as the housing. The abutment surface so defined has an area equal to one-half of the cross-sectional area of the housing. This arrangement of abutting surfaces can also be used to advantage when the housing is divided into three parts, with three abutting surfaces provided at each of the separating points.

DETAILED DESCRIPTION OF THE INVENTION

Figure 1:
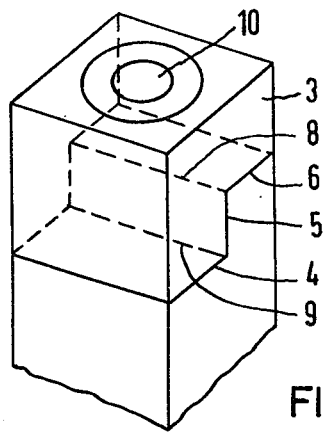
FIGS. 1 and 2 are views in perspective of a columnar proximity switch housing having a square cross section, showing the operating surfaces as they may be respectively offset relative to each other by 90°.
Figures 4, 5:
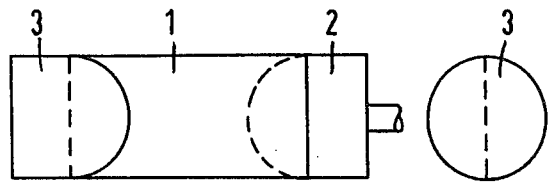
FIGS. 4 and 5 are side and end views of an assembled sensor of the type illustrated in FIG. 3 in which the operating direction of the sensor is axial relative to the cylindrical housing.

The proximity switch shown in the drawings consists of center part 1 which contains the circuit, connecting part 2, and sensor part 3 constituting the sensor. In the illustrative embodiment shown in FIGS. 1 and 2, which has a generally quadrilateral or square cross section, only center part 1 and sensor part 3 are shown. Center part 1 and sensor part 3 meet at a joint defined by intersecting abutting surfaces 4, 5 and 6. As seen from the side, the intersecting surfaces look like a Z. The height of longitudinal abutting surface 5 is indicated by the arrow 7 (FIG. 2) and corresponds to half the width of the square dimension of the housing. This provides a symmetry which makes it possible to connect sensor part 3 to center part 1, for axial activation, in the manner indicated in FIG. 1, or, for transverse activation, in the manner shown in FIG. 2. The boundary line between abutting surfaces 5 and 6 is designated 8, and that between abutting surfaces 4 and 5 is designated 9. The sensing surface of sensor part 3 bears the reference symbol 10.

Figure 2:
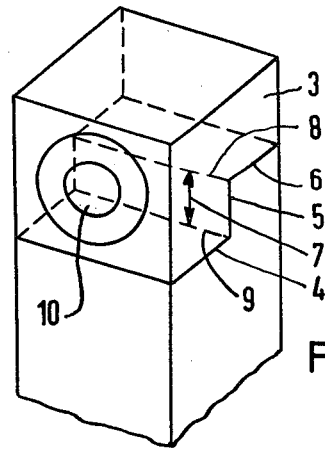

The abutting surfaces in the housing of square cross section, of FIGS. 1 and 2, are relatively symmetrical with respect to each other. However, when the proximity switch housing has a circular cross section, similarly placed abutting surfaces take different shapes, as can be seen in FIGS. 3-7. In the circular structure, longitudinal surface 5 of center part 1 extends, as before, from one end of center part 1 towards the middle. Lateral abutting surface 6 is again the endmost surface of center part 1 and meets longitudinal surface 5 in a straight line intersection 8. This surface is now semi-circular instead of rectangular. Lateral abutment surface 4, on the other hand, is a concave surface which intersects longitudinal surface 5 at curved boundary line 9 and, being perpendicular to longitudinal surface 5, intersects outer surface 12 of the housing in a curve. Sensor part 3 has, in addition to longitudinal surface 5 which corresponds in shape and size to longitudinal surface 5 of center part 1, projecting, convex abutting surface 4 which conforms to the concave surface of abutting surface 4 on center part 1. Similarly, transverse surface 6 center part 1 is abutted by transverse surface 6 on sensor part 3. When sensor part 3 is assembled to center part 1 with the axis of center part 3 and the axis of center part 1 in alignment as shown by the direction of the arrow, it will be seen that the parts are mated end to end, forming a continuous cylinder with abutting surfaces 4, abutting surfaces 5, and abutting surfaces 6 in juxtaposition (see FIGS. 4 and 5).

Figure 3:
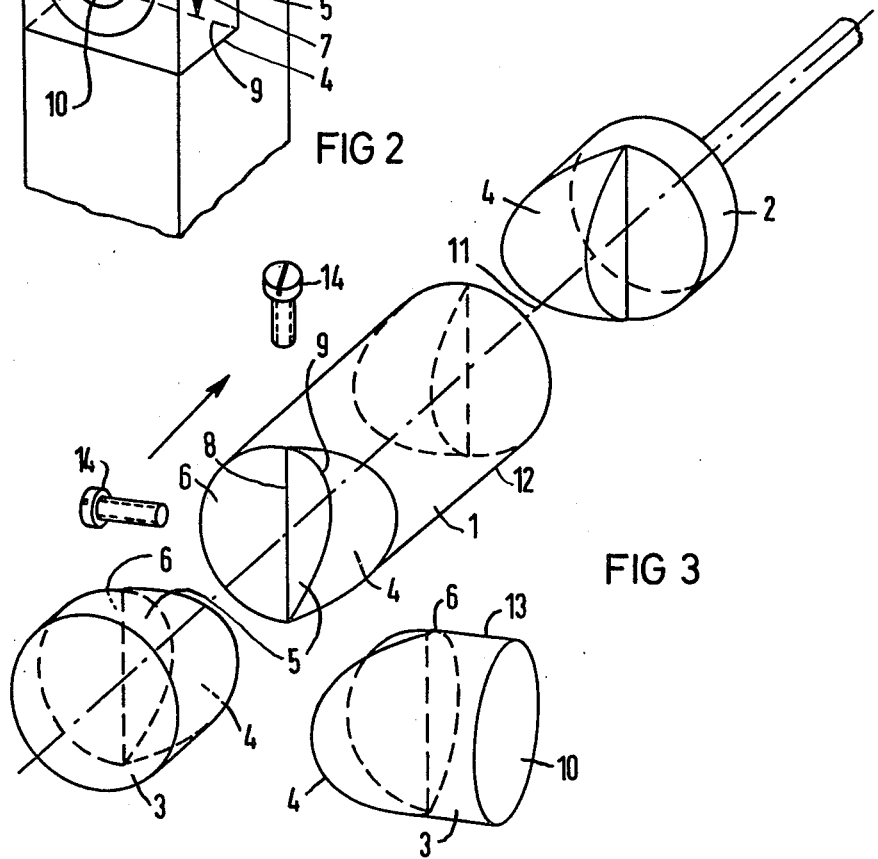
FIG. 3 is an exploded view of a proximity switch which has a housing of circular cross section.

The second position of sensor part 3, which provides for lateral operation, can be seen at FIG. 3, right, where the sensing surface of part 3 has been shifted 90°. Now, abutting surface 4 of part 3 will form, when assembled with center part 1, a continuing part of outer surface 12; also, a portion of outer surface 13 of part 3 now rests against abutment surfaces 4 of center part 1. Sensor surface 10 now includes a generatrix of outer surface 12.

Connecting part 2 can be connected to central part 1 in the same way as just described. It is also capable of both longitudinal or lateral orientation, e.g. of change of position by 90°.

Figures 6, 7:
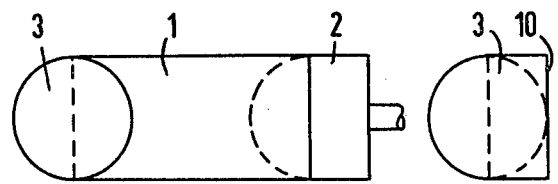
FIGS. 6 and 7 are side and end views of an assembled sensor of FIG. 3 in which the operation direction of the sensor is at 90° relative to the longitudinal axis of the housing.

It is clear, especially from FIGS. 3 and 7, that in sensor part 3 half of the diameter of the housing is available for receiving the ring-shaped cup core without need to extend sensor surface 10 beyond the most outward generatrix of the housing's outer surface; i.e., departure of passing articles from the surface of the housing is impossible. Also, this means that the proximity switch can be accommodated in a very small space.

Electrical connections between center part 1 and sensor part 3 or connecting part 2 can be made, in a manner not shown via flexible connecting lines which can be accommodated in recesses, not shown, in the vicinity of the longitudinal axes of center part 1, connecting part 2, and sensor part 3. The parts can be fastened to each other by means of screw clamps or snap in connections. In the exploded view of FIG. 3 screws 14 are shown which can be screwed in in different directions to connect the parts. Interconnection via cables has the advantage that no sealing problems such as otherwise can occur with cuts at an angle, arise and that terminations in connecting part 2 can be made via plug-in and screw connections in the cylindrical part.

What is claimed is:

1. In a proximity switch which can be operated without physical contact and which comprises an elongate, columnar housing having at least one lateral wall lying parallel to and spaced a predetermined distance from the principal axis of the housing, the housing being symmetrical about two orthogonal axes of symmetry which are perpendicular to the principal axis, and the housing having at least two parts which are joined at abutting surfaces which intersect the principal axis at an angle, the improvement in which:

the abutting surfaces joining the parts each comprise first, second and third abutting surfaces, the first surface being parallel to the principal axis, and the second and third surfaces each intersecting the first surface at an angle of 90°, the greatest dimension of the first abutting surface, measured in the direction of the principal axis, being equal to the shortest distance from the principal axis to the lateral wall;

the housing is circular in cross section; and the first abutting surface is joined to the second abutting surface along a straight line and to the third abutting surface along a semicircle, the area of the first surface being equal to half the cross-sectional area of the housing.

2. In a proximity switch in accordance with claim 1, the further improvement in which:

the housing comprises first, second, and third parts and the first and second parts and the second and third parts are each joined by three abutting surfaces.

* * * * *